United States Patent [19]

Bakos et al.

[11] 4,246,147

[45] Jan. 20, 1981

[54] SCREENABLE AND STRIPPABLE SOLDER MASK AND USE THEREOF

[75] Inventors: Peter Bakos, Endicott; Russell E. Darrow, Newark Valley; Dennis L. Rivenburgh, Endicott; William F. Williams, Vestal, all of N.Y.

[73] Assignee: International Business Machines Corporation, Armonk, N.Y.

[21] Appl. No.: 45,524

[22] Filed: Jun. 4, 1979

[51] Int. Cl.$^3$ .................... B05D 1/32; C08J 3/18; C08K 5/54; C08L 91/00

[52] U.S. Cl. ................. 260/18 EP; 260/18 N; 260/29.1 SB; 260/29.8; 260/33.4 R; 260/33.4 EP; 427/259; 427/272; 427/282; 428/334; 428/335

[58] Field of Search .............. 427/259, 272, 282; 260/18 EP, 29.1 SB, 29.8, 18 N, 33.4 R, 33.4 EP; 428/334, 335

[56] References Cited

U.S. PATENT DOCUMENTS

| | | | |
|---|---|---|---|
| 3,073,785 | 1/1963 | Angelo | 528/183 |
| 3,288,754 | 11/1966 | Green | 525/423 |
| 3,305,504 | 2/1967 | Huntington | 525/1 |
| 3,440,203 | 4/1969 | Boldebuck et al. | 525/431 |
| 3,458,925 | 8/1969 | Napier et al. | 427/282 |
| 3,556,754 | 1/1971 | Marsden et al. | 525/509 |
| 3,781,237 | 12/1973 | Alvino et al. | 525/436 |
| 3,816,364 | 6/1974 | Bayer | 260/18 EP |
| 3,843,577 | 10/1974 | Keil | 260/29.1 SB |
| 3,926,885 | 12/1975 | Keil | 260/29.1 SB |
| 4,121,000 | 10/1978 | Wald | 260/29.1 SB |

FOREIGN PATENT DOCUMENTS 416476 9/1934 United Kingdom .................. 260/29.8

OTHER PUBLICATIONS

Condensed Chemical Dictionary, Reinhold Publishing Corp., N.Y., N.Y., Fifth Edition, 1956, p. 1073.

*Primary Examiner*—Ronald W. Griffin
*Attorney, Agent, or Firm*—Pollock, Vande Sande & Priddy

[57] ABSTRACT

A screenable and strippable solder mask composition which contains a polyepoxide or polyimide/amide; a detackifier and a high-temperature resistant filler; and use thereof for protecting predetermined areas on a substrate from the solder deposition.

33 Claims, No Drawings

SCREENABLE AND STRIPPABLE SOLDER MASK AND USE THEREOF

DESCRIPTION

Technical Field

The present invention is concerned with compositions which are particularly suitable as patternable solder masks and are strippable from the substrate upon which they are applied. In addition, the present invention is concerned with the method for protecting predetermined areas on a substrate from the deposition of solder by employing the solder mask compositions and then subsequently removing the compositions after the solder mask is applied.

The compositions and methods of the present invention are especially significant in the manufacture of integrated circuit electronic packages which involve the interconnection between the integrated circuit carrier or substrate and the integrated circuit semiconductor device or chip. In addition, the present invention is especially applicable for those products wherein more than one chip or semiconductor device is to be attached to a single carrier or substrate.

BACKGROUND ART

An integrated circuit electronic package can be fabricated by applying to a ceramic substrate or carrier a chrome layer followed by a copper layer followed by another chrome layer. Next, a photoresist composition is applied so that selected areas of the chrome/copper/chrome layers can be removed to provide the desired electrical connections on the substrate. The top chrome layer in predetermined areas is removed by known etching techniques. The top chrome layer is present so that subsequently applied solder will not adhere to the substrate in those areas where the chrome remains.

Next, exposed copper is removed from preselected areas wherein it is desired to include solder, such as around the holes wherein pins are to be subsequently inserted, and at the places where the semiconductor chip(s) are to be interconnected by solder with the substrate. The copper layer provides electrical conductivity.

Next the exposed areas of the bottom layer of chrome are removed by etching. The bottom chrome layer is employed to provide adequate adhesion between the copper layer and the ceramic substrate.

After the input/output pins are inserted into the substrate, solder is applied to the substrate and will deposit on the input/output pins and the exposed copper regions, but not on the substrate itself and not on the exposed chrome areas.

A problem with this particular technique is that the solder when applied forms ball- or sphere-like deposits on the exposed areas. Such, however, are of uneven height. This is significant in the regions where the chip is to be connected to the substrate. Such regions are commonly referred to in the art as the chip pad area. The uneven deposits in the chip pad area can cause electrical shorts and early thermal cycle (fatigue) failures. Solder is also applied to the integrated circuit chips but such is of a fairly uniform and even coating since it is applied by evaporation techniques. However, evaporation techniques are not especially suitable for applying solder to the substrates since evaporation techniques are relatively expensive and too slow for high volume production. Also, the high temperatures employed in evaporation techniques are likely to destroy photomasks while the solder is being deposited resulting in the photomask not performing its intended function of defining the areas where the solder is to be deposited.

The above problems with respect to the prior art are obviated by the present invention whereby certain compositions are applied to the chip pad area to protect it from having the solder deposit on the exposed copper. Accordingly, upon removal of the composition, the only solder present which is needed to connect the chip and substrate is that on the chip which is, as discussed hereinabove, present as an even coating. This results in uniform height and increased reliability of the packages so made. Also, the fact that no solder was initially present on the copper and the chip pad area does not in any way reduce the strength of the bond between the chip and substrate.

For a composition to be suitable for the above purpose, it must possess a number of characteristics, some of which seem to be contradictory to other needed characteristics of the composition. For instance, the composition must be readily accurately applied to the desired area to be protected from the solder. This requires that the composition have certain flow characteristics.

The composition must be resistant to the solder at the conditions at which the solder is applied to the substrate. Moreover, the composition must be sufficiently adherent to the substrate so that the solder will not seep or flow underneath the composition and contact those copper areas which are to be protected. However, contrary to this property of adherence to the substrate, it is necessary that the composition not so tenaciously adhere to the substrate that subsequent removal of the composition is impractical and/or destructive to the substrate or other layers thereon. Accordingly, the composition must be readily strippable, yet adequately adhere to the substrate to be suitable for the purposes to which the present invention are directed.

Providing compositions containing all of the above properties is quite difficult. The difficulties in finding suitable compositions is further magnified by the fact that integrated circuits are getting more complex and that various patterns on the substrates are getting closer together and are becoming more difficult to follow. Therefore, the patternable properties of a composition for such purpose are very demanding.

The above objects have been accomplished by the present invention which provides a composition containing a polyepoxide or polyimide/amide, certain oil detackifiers, and high temperature resistant fillers in particular relative amounts. The detackifiers include liquid silicone oils, drying oils, terpenes and terpineols.

The prior art does not suggest the compositions of the present invention and does not suggest that such would possess the critical combination of properties necessary to permit the compositions to be used as a soldering mask in the type of process discussed hereinabove. For instance, U.S. Pat. No. 3,288,754 to Green suggests reacting a reactive or functional silane with a polyimide/amide. On the other hand, as discussed hereinabove, the present invention requires a mixture which can include a silicone material with a polyamide/imide rather than a reaction product. Also, as will be discussed hereinbelow, the silicone when employed does not substantially react with the polyamide/imide but instead during the process vaporizes. Furthermore, the composition of the present invention employs certain quantities of particular types of fillers which are not suggested in U.S. Pat. No. 3,288,754.

U.S. Pat. Nos. 3,843,577 and 3,926,885 to Keil, although suggesting compositions containing a polyepoxide and certain specific siloxanes, fail to suggest the present invention since, among other things, these patents require the presence of an incompatible lubricant and employ a curing agent. Furthermore, these patents do not suggest the types of properties achieved by the particular compositions of the present invention, and, in fact, such properties seem to be contrary to those desired by said patent particularly because of the presence of the curing agents.

U.S. Pat. No. 4,121,000 to Wald, although suggesting a composition which can contain an epoxy polymer and a polysiloxane fluid, fails to teach the present invention since, among other things, such patent requires the presence of a large amount of other polymeric materials in the composition as well as hardening agents.

U.S. Pat. No. 3,816,364 to Bayer, although suggesting certain compositions which contain an epoxy and a dimethyl silicone, fail to teach the present invention since, among other things, such compositions require solid epoxies and do not suggest the same amounts of silicone as are required by the present invention.

U.S. Pat. No. 3,781,237 to Alvino et al suggests a composition which contains a polyimide/amide and a polysiloxane. However, such patent fails to suggest the present invention since, among other things, the quantity of polysiloxane required by said patent is significantly less than that employed according to the present invention.

U.S. Pat. No. 3,440,203 to Boldebuck et al also suggests a composition which contains a polyimide and a polysiloxane. However, this patent fails to suggest or render obvious the present invention since the amount of polysiloxane required by this patent is significantly less than that employed according to the present invention.

U.S. Pat. No. 3,556,754 to Marsden et al suggests compositions which contain a specific type of silicone and a polymer which can be an epoxy for use in sizing glass fibers. However, this patent fails to suggest the present invention since, among other things, the amount of silicone suggested is much less than that employed according to the present invention.

U.S. Pat. No. 3,305,504 to Huntington suggests a composition which contains an epoxy and a silicone gum. This patent fails to suggest the present invention since, among other things, it requires a silicone gum whereas the present invention employs a silicone oil.

DISCLOSURE OF INVENTION

The present invention is concerned with a screenable and strippable solder mask composition. The composition contains a film-forming polymer portion in the form of a liquid composition wherein the polymer is a polyimide/amide or a liquid polyepoxide. The composition also includes a detackifier which is compatible with the polymer and which is a fluid silicone oil and/or a terpene and/or a terpineol and/or a drying oil. Also present in the composition is a solid high temperature resistant filler which is employed in an amount sufficient to render the composition removable from the substrate after solder application. The ratio of the polymer in the polymer portion to the detackifier is from about 2:1 to about 1:3. In addition, when the polymer is a polyepoxide, the detackifier employed includes said liquid silicone. The above ratio between the polymer component and detackifier is based upon the total amount of polymer in the polymer portion and detackifier present and does not include, for instance, amount of solvent, if present, which is used to place the polymer in the form of a liquid polymer composition.

The present invention is also concerned with the use of the above compositions for protecting predetermined areas on a substrate from solder deposition. The process comprises applying to predetermined areas of the substrate by screen printing the above-defined patternable composition. The coated substrate is dried to thereby harden the composition. Solder is applied whereby the solder does not adhere to those areas protected by the baked solder mask composition. After solder application, the solder mask is removed from the substrate.

In addition, the present invention is concerned with a substrate coated with the above solder mask composition in predetermined areas of the substrate and being less than the entire substrate.

BEST MODE FOR CARRYING OUT THE INVENTION

The screenable and strippable solder mask composition of the present invention contains a film-forming polymer portion in the form of a liquid composition, a detackifier, and a solid high temperature resistant filler.

The film-forming polymer portion of the composition includes either a polyimide/amide polymer or a liquid polyepoxide. The polymer portion of the composition must be in the form of a liquid composition. Accordingly, the polymer portion can be either the polyepoxide which is already in liquid form, or a solution or dispersion thereof in a nonreactive diluent, or a solution or dispersion of the polyimide/amide in a nonreactive diluent.

The polyimide/amide polymers employed according to the present invention are well known and are available commercially. Such are sometimes referred to in the literature as polyamides or polyamide-acids and are actually non-fully cured polymers which contain varying amounts of amide and imide groupings along the polymer chain. The imide groups are obtained by condensation of the amide form with an acid group of the polymer chain. Such polymers are generally prepared by reacting at least one diamine with at least one polycarboxylic acid and/or anhydride thereof and/or ester thereof. Suggestions of various polyimide/amides can be found in U.S. Pat. Nos. 2,710,853; 2,712,543; 2,731,447; 2,880,230; 3,037,966; 3,073,784; 3,073,785; 3,179,631; 3,179,632; 3,179,633; 3,179,634; 3,179,635; and 3,190,856, disclosures of which are incorporated herein by reference. The preferred polyimide/amide polymers employed according to the present invention are those obtained by reacting an aromatic diamine with an aromatic tetracarboxylic acid dianhydride.

Examples of some anhydrides employed in preparing the polyimide/amide are pyromellitic dianhydride; mellitic anhydride; trimellitic anhydride; 2,3,6,7-naphthalene tetracarboxylic dianhydride; 1,2,5,6-naphthalene tetracarboxylic dianhydride; 3,3',4,4'-diphenyltetracarboxylic dianhydride; 2,2',3,3'-diphenyltetracarboxylic dianhydride, 3,3',4,4'-diphenylmethane tetracarboxylic dianhydride; bis(3,4-carboxyphenyl)ether dianhydride; bis(2,3-dicarboxyphenyl)sulfone dianhydride; 3,3',4,4' benzophenone tetracarboxylic dianhydride; 3,3',4,4' stilbenetetracarboxylic dianhydride; 2,3,6,7- anthracenetetracarboxylic dianhydride; 1,2,7,8-phenanthrenetetracarboxylic dianhydride; 2,3,6,7-naphthacene tetracarboxylic dianhydride; 2,3,8,9-chrysene tetracarboxylic dianhydride; 2,3,6,7,-triphenylene tetracarboxylic dianhydride; pyrene-4,5,9,10-tetracarboxylic dianhydride; perylene-3,4,9,10-tetracarboxylic dianhydride; and coronene-1,2,7,8-tetracarboxylic dianhydride.

Examples of some aliphatic organic diamines are ethylenediamine; N-methylethylenediamine; trimethylenediamine; tetramethylenediamine; 1,5-diaminopentane; hexamethylenediamine; 1,4-diaminocyclohexane; 1,3-diaminocyclopentane; 1,3-diamino-2-methylpropane; 1,6-diamino-4-methylhexane; 1,4-diamino-2-methyl butane; 1-(N-propylamino)-6-aminohexane; and 1,3-diamino-2-phenylpropane.

Examples of some aromatic-aliphatic diamines are para-aminophenylmethylamine, and meta-aminophenylmethylamine. Examples of some aromatic organic diamines are 2,2-di(4-aminophenyl)propane; 4,4'-diaminodiphenylmethane; benzidine; mono-N-methylbenzidine, 3,3'-dichlorobenzidine; 4,4'-diaminodiphenylsulfide; 3,3'-diaminodiphenyl sulfone; 4,4'-diaminodiphenyl sulfone; 4,4'-diaminodiphenyl ether; 1,5-diaminonaphthalene; meta-phenylenediamine; para-phenylenediamine; 3,3'-dimethyl-4,4'-biphenyldiamine; 3,3'-dimethoxybenzidine; 1-isopropyl-2,4-phenylenediamine; 3,5-diaminoorthoxylene; 3,5-diaminodiphenyl; 1,3-diaminonaphthalene; 2,6-diamino anthracene; and 4,4'-diaminostilbene. The most preferred aromatic diamines are 4,4'-diaminodiphenyl ether, 4,4'-diaminodiphenylmethane and paraphenylenediamine.

The polyimide/amides employed according to the present invention generally have molecular weights from about 500 to about 2500, and when combined with just the diluent preferably have a viscosity of about 25-150 centipoises at normal room temperature (e.g. about 25° C.). The polyimide/amides are in the form of solid polymeric materials and, accordingly, are admixed with an inert diluent prior to admixture with the other components of the composition. Examples of some inert diluents which do not react with the diamines or dianhydrides employed to prepare the polyimide/amides or react with the product include organic polar solvents which have a dipole moment whose functional groups do not react with the precursors (e.g. the diamines or the dianhydrides). Examples of some suitable organic polar solvents include N,N-dimethylformamide, N,N-dimethylacetamide, N-methyl-2-pyrrolidone, N,N-diethylformamide, N,N-diethylacetamide, N,N-dimethylmethoxyacetamide, dimethylsulfoxide, diethylsulfoxide, pyridine, dimethylsulfone, diethylsulfone, dipropylsulfone, hexamethylphosphoramide, tetramethylenesulfone, dimethyltetramethylenesulfone, and dimethoxytetramethylenesulfone. Mixtures of diluents can be employed when desired.

Further, the above diluents can be in combination with minor amounts of non-solvents such as benzene, benzonitrile, dioxane, butyrolactone, xylene, toluene, and cyclohexane provided the combination places the polymer in liquid form. The preferred diluent to employ along with the polyimide/amide is N-methyl-2-pyrrolidone. The amount of diluent used based upon amount of polyimide/amide is such as to provide a composition of the polyimide/amide and diluent having a viscosity of about 25-150 centipoises at about 25° C. Generally, the polyimide/amide is employed in amounts of about 5 to about 35% by weight and corresponding the diluent is employed in amounts of about 95 to about 65% by weight, these relative amounts being based upon the total amounts of polyimide/amide and diluent being employed.

When the polymer employed is a polyepoxide, such must be a liquid polyepoxide. The preferred types of epoxy polymers employed according to the present invention are the polyepoxides of epichlorohydrin and bisphenol A, i.e. 2,2-bis(p-hydroxyphenyl)propane. However, it is understood that other epoxy polymers can be employed according to the present invention and include those obtained by reacting a polynuclear dihydric phenol with a halo-epoxy alkane in general.

Suitable polynuclear dihydric phenols can have the formula:

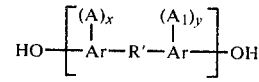

wherein Ar is an aromatic divalent hydrocarbon such as naphthalene and, preferably, phenylene, A and $A_1$ which can be the same or different are alkyl radicals, preferably having from 1 to 4 carbon atoms, halogen atoms, i.e., fluorine, chlorine, bromine and iodine, or alkoxy radicals, preferably having from 1 to 4 carbon atoms, x and y are integers having a value 0 to a maximum value corresponding to the number of hydrogen atoms on the aromatic radical (Ar) which can be replaced by substituents and $R^1$ is a bond between adjacent carbon atoms as in dihydroxydiphenyl or is a divalent radical including, for example,

—O—, —S—, —SO—, —SO$_2$— and —S—S— and divalent hydrocarbon radicals, such as alkylene, alkylidene, cycloaliphatic, e.g., cycloalkylene and cycloalkylidene, halogenated, alkoxy or aryloxy substituted alkylene, alkylidene and cycloaliphatic radicals as well as alkarylene and aromatic radicals including halogenated, alkyl, alkoxy or aryloxy substituted aromatic radicals and a ring fused to an Ar group; or $R^1$ can be polyalkoxy, or polysiloxy, or two or more alkylidene radicals separated by an aromatic ring, a tertiary amino group, an ether linkage, a carbonyl group or a sulfur containing group such as sulfoxide, and the like.

Examples of specific dihydric polynuclear phenols include, among others, the bis-(hydroxyphenyl)alkanes such as 2,2-bis-(4-hydroxyphenol)propane, 2,4'-dihydroxydiphenylmethane, bis-(2-hydroxyphenyl)methane, bis-(4-hydroxyphenyl)methane, bis(4-hydroxy-2,6-dimethyl-3-methoxyphenyl)methane, 1,1-bis-(4-hydroxyphenyl)ethane, 1,2-bis-(4-hydroxyphenyl)ethane, 1,1-bis(4-hydroxy-2-chlorophenyl)ethane, 1,1-bis(3-methyl-4-hydroxyphenyl)ethane, 1,3-bis-(3-methyl-4-hydroxyphenyl)propane, 2,2-bis-(3-phenyl-4-hydroxyphenyl)propane, 2,2-bis-(3-isopropyl-4-hydroxyphenyl)propane, 2,2-bis(2-isopropyl-4-hydroxyphenyl)propane, 2,2-bis(4-hydroxynaphthyl)propane, 2,2-bis-(4-hydroxyphenyl)pentane, 3,3-bis-(4-hydroxyphenol)pentane, 2,2-bis-(4-hydroxyphenyl)heptane, bis-(4-hydroxyphenyl)phenylmethane, bis-(4-hydroxyphenyl)cyclohexylmethane, 1,2-bis-(4-hydroxyphenyl)-1,2-bis-(phenyl)propane and 2,2-bis-(4-hydroxyphenyl)-1-phenyl-propane; di(hydroxyphenyl)sulfones such as bis(4-hydroxyphenyl)sulfone, 2,4'-dihydroxydiphenyl sulfone, 5'-chloro-2,4'-dihydroxydiphenyl sulfone, and 5'chloro-4,4'-dihydroxydiphenyl sulfone; di(hydroxyphenyl)ethers such as bis-(4-hydroxyphenyl)ether, the 4,3'-, 4,2'-, 2,2'-, 2,3'-, dihydroxydiphenyl ethers, 4,4'-dihydroxy-2,6-dimethyldiphenyl ether, bis-(4-hydroxy-3-isobutylphenyl)ether, bis-(4-hydroxy-3-isopropylphenyl) ether, bis-(4-hydroxy-3-chlorophenyl)-ether, bis-(4-hydroxy-3-fluorophenyl)ether, bis-(4-hydroxy-3-bromophenyl)ether, bis-(4-hydroxynaphthyl)-ether, bis-(4-hydroxy-3-chloronaphthyl)-ether, bis-(2-hydroxydiphenyl)ether, 4,4'-dihydroxy-2,6-dimethoxydiphenyl ether, and 4,4'-dihydroxy-2,5-diethoxydiphenyl ether.

The preferred dihydric polynuclear phenols are represented by the formula:

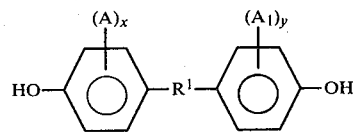

wherein A and $A_1$ are as previously defined, x and y have values from 0 to 4 inclusive and $R^1$ is a divalent saturated aliphatic hydrocarbon radical, particularly aklylene and alkylidene radicals having from 1 to 3 carbon atoms, and cycloalkylene radicals having up to and including 10 carbon atoms. The most preferred dihydric phenol is bisphenol A, i.e., 2,2-bis(p-hydroxyphenyl)propane.

The halo-epoxy aklane can be represented by the formula:

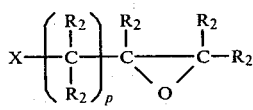

wherein X is a halogen atom (e.g., chlorine, bromine, and the like), p is an integer from 1–8, each $R_2$ individually is hydrogen or alkyl group of up to 7 carbon atoms; wherein the number of carbon atoms in any epoxy alkyl group generally totals no more than 10 carbon atoms.

While glycidyl ethers, such as derived from epichlorohydrin, are particularly preferred in the practice of this invention, the epoxy polymers containing epoxyalkoxy groups of a greater number of carbon atoms are also suitable. These are prepared by substituting for epichlorohydrin such representative corresponding chlorides or bromides of monohydroxy epoxyalkanes as 1-chloro-2,3-epoxybutane, 1-chloro-3,4-epoxybutane, 2-chloro-3,4-epoxybutane, 1-chloro-2-methyl-2,3-epoxy-propane, 1-bromo-2,3-epoxy-pentane, 2-chloromethyl-1,2-epoxybutane, 1-bromo-4-methyl-3,4-epoxypentane, 1-bromo-4-ethyl-2,3-epoxypentane, 4-chloro-2-methyl-2,3-epoxypentane, 1-chloro-2,3-epoxyoctane, 1-chloro-2-methyl-2,3-epoxyoctane, or 1-chloro-2,3-epoxydecane.

The polyepoxides generally have a viscosity in the range of about 400 centipoises to about 5000 centipoises at 25° C., and a molecular weight of 170 to about 250. If desired, a diluent can be employed along with the polyepoxide provided the viscosity of the polyepoxide and diluent is about 400 to about 5000 centipoises at 25° C. Such diluents include aromatic hydrocarbons such as toluene and xylene.

The composition must also include a constituent which functions as a detackifier and is compatible with the polymer portion of the composition. The detackifier reduces the tackiness or stickiness of the composition in order to facilitate and enhance the screening process used to apply the compositions to the predetermined portions of the substrate. This is particularly important since as the fineness of the screens increases, the importance in controlling the tackiness and also the viscosity becomes even more significant.

The component of the composition which has been referred to as the detackifier also functions as a viscosity adjuster to provide the proper viscosity of the composition for the screening application and to render the composition a practical, screenable preparation especially suitable for the intended purposes of the present invention in the preparation of electronic packages involving integrated circuits. With respect to detackifying, the composition when applied must not stick to the pattern or else a distortion in the pattern will occur upon removal thereof from the substrate.

The detackifying component of the composition actually is removed during drying and/or soldering such as by decomposition and vaporization. The detackifying component should not carbonize to an undesired extent and leave a residue on the substrate which would be difficult to remove in subsequent cleaning and removal steps.

It has been found according to the present invention that when the polymer of the film-forming polymer portion is a polyimide/polyamide, the detackifier can be a liquid silicone oil, a drying oil, a terpene or a terpineol. Mixtures of these particular detackifiers can be employed when desired as long as they are compatible with each other.

When the film-forming polymer is a liquid polyepoxide, the detackifier includes a liquid silicone oil. It is essential when employing a liquid polyepoxide as the film-forming polymer to employ a silicone oil in the detackifier since the silicone oil aids in the subsequent polymerization of the epoxy prior to contact with the solder composition. The detackifiers employed according to the present invention generally have viscosities of about 25 to about 500 centipoises at 25° C.

The liquid silicone fluids which can be employed in the present invention are well known materials. For instance, many of the silicones contain two or more siloxane units represented by the average unit formula of:

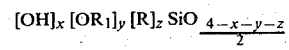

Each R is individually an alkyl radical, cycloalkyl radical, alkenyl radicals, aryl radicals, aralkyl radiclas, cycloalkenyl radicals, halogenated derivatives of the above radicals, and cyanoalkyl radicals; $OR_1$ is an alkoxy or acyloxy radical. Mixtures of the above R and $OR_1$ radicals can be employed when desired.

Generally x has a value of about 0 to about 1; y has a value of about 0 to about 1; the sum of x+y has a value of about 0 to about 1; and z has a value of about 1 to about 2.

Preferably R is selected from the group of lower alkyl radicals having 1 to 18 carbon atoms; cycloaklyl radicals having 5 to 7 carbon atoms in the ring; lower alkenyl radicals having 2 to 8 carbon atoms;

mononuclear aryl radicals; mononuclear aryl lower alkyl radicals having 1 to 6 carbon atoms in the alkyl group; cycloalkenyl radicals having 5 to 7 carbon atoms in the ring and halogenated derivatives of these radicals.

More specifically, R is selected from the class of lower alkyl radicals, e.g., methyl, ethyl, propyl, butyl, octyl, and octadecyl radicals; cycloalkyl and cycloalkenyl radicals having 5 to 7 carbon atoms in the ring, e.g., cyclopentyl, cyclohexyl, cycloheptyl, and cyclohexenyl radicals; lower alkenyl radicals, e.g., vinyl and allyl radicals; mononuclear aryl, e.g., phenyl, tolyl and xylyl radicals; mononuclear aryl lower alkyl radicals, e.g. benzyl and phenylethyl radicals; halogenated derivatives of the above radicals; and cyanoalkyl radicals, e.g., chloromethyl, beta-chloroethyl, chlorophenyl, dibromophenyl and trifluoromethylethyl radicals. Preferably, R is selected from the class of methyl, ethyl and phenyl.

The alkoxy radical, $OR_1$, is selected from the class of lower alkoxy radicals having 1 to 8 carbon atoms, e.g., methoxy, ethoxy, propoxy and isopropoxy radicals. The acyloxy radical, $OR_1$, is from a saturated aliphatic monoacyl radical of a carboxylic acid such as formyl, acetyl, propionyl, butyryl, hexoyl, 2-ethylhexoyl, octanoyl, isovaleryl and stearyl with acetyl being preferred. It is also understood, that copolymers containing two or more different siloxane units can be employed. The silicone fluids can be end stopped with any of the end stopping groups employed in silicone polymers for such purposes. The preferred silicone fluids employed in the present invention are the liquid polydimethylsiloxanes and especially those end stopped with three methyl groups on both ends of the polymer. The number of repeating units of the silicone is selected so as to provide a viscosity in the final composition of about 50 to 500 centipoises measured at 25° C. Preferably the viscosity is about 100 to about 300 centipoises.

Another class of detackifiers which can be employed according to the present invention when the film-forming polymer is a polyimide/amide are the drying oils. By the use of drying oils is meant to include natural drying oils which as is well known are glycerides of fatty acids which contain two or more double bonds whereby on exposure to air, oxygen can be absorbed to give peroxides which catalyze the unsaturated portions, as well as the glycerides of the ethylenically unsaturated fatty acids per se of said oils and other natural or synthetic ethylenically unsaturated esters having similar properties.

The detackifier according to the present invention when the film-forming polymer is a polyimide/amide can include the terpenes, such as turpentine. Also, the detackifier can be one or more of the terpineols, such as α-terpineol.

It is understood, that mixtures of the various detackifiers can be employed when desired provided such are compatible with each other and with the particular polymer employed.

The detackifier must be one which is substantially removed from the composition during drying and/or soldering such as by decomposition and vaporization. In addition, the detackifier should not carbonize to any great extent and leave an undesired residue on the surface of the substrate which residue will be difficult to subsequently remove.

The screenable and strippable solder mask composition of the present invention also includes a solid filler. The solid filler must be one which is resistant to exposure to elevated temperatures. In particular, such must be capable of withstanding the elevated temperatures from exposure to the hot solder and should withstand temperatures of at least about 300° C. and preferably at least about 350° C. The solder is generally applied at temperatures between about 300 and about 400° C. Examples of some suitable solid high-temperature resistant fillers include ground glass, zinc oxide, silicon dioxide, alumina, diamond dust, and the high temperature resistant sands.

The filler employed generally has a particle size of about 0.1 to about 20 microns and preferably about 0.1 to about 5 microns. It is important that the filler be of a fine particle size in order that it can be adequately used in the preparation of the integrated circuit electronic packages.

The amount of filler employed is such as to render the composition readily strippable or removable from the substrate after use, such as by mere washing. It is believed that the filler tends to retard the polymerization or cross-linking of the film-forming materials to molecules of very high molecular weight thereby preventing the polymer from too tenaciously adhering to the substrate. On the other hand, the type and size and amount of filler must be such that it does not destroy the bond between the substrate and composition to such an extent that it would not be usable as a solder mask.

Also, the composition should be substantially, if not entirely, free of hardeners for the polymers present in the composition.

The compositions employed according to the present invention generally have a viscosity of about 700 to about 5000 centipoises at 25° C. The preferred viscosity of the compositions are about 1000 to about 13000 and the most preferred are about 7000 to about 12500 centipoises at 25° C.

The ratio of the film-forming polymer of the polymer portion of the composition relative to the detackifier is generally about 2:1 to about 1:3, and preferably 1:1 to about 2:3.

The amount of filler employed relative to the film-forming polymer component of the polymer portion of the composition is about 1:6 to about 6:1 and preferably about 2:1 to about 6:1.

The composition must not be miscible with the solder at the conditions of applying the solder. Also the components of the composition should be compatible with each other.

A typical process for employing the screenable and strippable solder mask composition of the present invention includes applying the solder composition to a predetermined area (e.g. less than the entire area) of a substrate, such as a ceramic substrate, to which the integrated circuit chip is subsequently attached. A ceramic is a product or material manufactured by the action of heat on earthly raw materials. The preferred ceramic substrates include silicon oxides and silicates, such as aluminum silicate, and aluminum oxides.

The substrates can include preformed holes through which input/output (I/O) pins can be inserted so as to protrude from one surface of the substrate for insertion into circuit cards or boards. The pins also protrude slightly from the other surface referred to as the backside so as to contact the circuitry on the backside which in turn connects to the integrated circuit chip mounted on the backside of the substrate. The area to be protected or shielded from the solder is determined by use of screen coating techniques.

The coating is generally applied to the substrate in thicknesses of about 1 to about 25 mils, preferably about 5 to about 10 mils, and most preferably about 2 to about 3 mils.

The coated substrates are then dried in order to cause hardening of the coating composition. The drying is generally conducted at about 50° to about 150° C. and is completed in about 10 to about 30 minutes. This step can also cause some, if not all, of the decomposition and vaporization of the detackifying component of the composition. The substrates are then pinned such as using standard pinning equipment. Less preferably, the pinning operation can be conducted prior to the coating step. After pinning and hardening of the coating composition, the substrates are "tinned" or exposed to solder by either the dip tinners or the wave solder techniques. During the solder or tinning operation, the areas covered with the solder mask composition are protected from having solder adhered thereto. The solder or tin will adhere to the exposed copper substrates, such as the pins and areas around the pins. The tin or solder is generally applied at temperatures between about 300° and about 400° C. During the soldering, any detackifier remaining decomposes and vaporizes.

Upon quenching of the soldered substrate, the mask composition due to the rapid change in temperature and differences in rate of contraction between the substrate and composition breaks loose from the substrate. Any solder mask composition still remaining on the substrate can be removed by light brushing and/or by exposure to a solvent such as N-methyl-2-pyrrolidone or trichloroethylene or perchloroethylene for a short time. The contact with the solvents should be carried out while the substrate is at a temperature between about 100° and 180° C. and the contact with the solvent is conveniently started about 10 secs. to about 2 mins. after completion of the solder operation.

The contact with the solvent is generally from about 4 seconds to about 60 seconds and preferably from about 4 to about 25 seconds. The solvent can be sprayed onto the substrate, such as at pressures of about 10 to 80 psi and preferably about 30 to about 60 psi.

If desired, the substrate can be vibrated or agitated such as at about 20–30 cycles with a lateral displacement of about 50–200 mils or at about 120–160 cycles with a lateral displacement of about 5 to about 25 mils to assure removal of any particles, and air blown to further assure removal therefrom of any particles remaining from the soldering mask. It is noted, that if the substrates are cooled down to room temperature, prior to removal of the solder mask composition by exposure to the solvents, it is necessary that they be refluxed, retinned and then quenched to facilitate removal of the solder mask composition at this stage of the process.

The soldering is usually completed in about 5 to about 25 seconds. The substrates are then ready for further processing as conventionally carried out, such as by contacting with the desired integrated circuit chip or chips wherein only the chip contains solder for attachment to the substrate rather than both the chip and the substrate containing solder as employed according to prior art techniques. As discussed hereinabove, the present invention provides a number of significant advantages, particularly in the production of electronic packages employing integrated circuits. Some advantages are the elimination of high solder on the chip pad area, the elimination of bridging in the chip pad area, the prevention of flux stains from occurring in the chip pad area, the prevention of chrome attachment or breakdown in the chip pad area, the providing of a flat even plane for chip positioning and reflow of the solder, the prevention of the reduction of the chip pad size. For instance, normally during the solder operation, a finite amount of copper is dissolved in the solder. Accordingly, this copper removal will reduce the amount of copper in the pad area.

The following non-limiting examples are presented to further illustrate the present invention.

EXAMPLE 1

A composition containing about 20 parts by weight of an epichlorohydrin-bisphenol-A epoxy of about 200 molecular weight commercially available under the trade designation Shell Epon 28; about 65 parts by weight of silicon dioxide having a particle size of about 0.3 micron; and about 15 parts by weight of a polydimethylsiloxane end blocked or terminated with methyl groups having a viscosity of about 200 centipoises available from Dow Corning under the trade designation Fluide #200 are admixed. The composition is screen coated onto a copper-clad ceramic substrate and is dried at about 150° C. for about 25 minutes. After the substrate is supplied with input/output pins, the substrate is then subjected to soldering employing a tin-lead (90-10) alloy at about 360° C. for about 15 seconds. The substrates are then quenched to a temperature of about 150° C. and exposed to a spray of perchloroethylene at about 60 psi. The mask composition is removed from the substrate. A silicon integrated circuit chip containing solder is attached to the chip pad area of the substrate by a solder reflow technique. The results provide for even or level attachment of the chip to the pad area. Tests directed to the pull strength necessary to separate the chip from the pad indicates that such is similar to that needed to separate the chip from the pad prepared by the standard type of process wherein both the pad and chip contain solder.

EXAMPLE II

The general process of Example I is repeated except that the coating composition employed contains about 15 parts by weight of Shell Epon 28 resin; about 70 parts by weight of zinc oxide having a particle size of about 1 micron, and about 15 parts by weight of the polydimethylsiloxane of the type used in Example I.

The results obtained are similar to those of Example I.

EXAMPLE III

The general process of Example I is repeated except that the coating composition employed contains about 15 parts by weight of Shell Epon 28 epoxy resin; about 70 parts by weight of ground glass having a particle size of about 10 microns; and about 15 parts by weight of the polydimethylsiloxane of the type used in Example 1.

The results obtained are similar to those of Example 1.

EXAMPLE IV

The general process of Example I is repeated except that the coating composition employed contains about 10 parts by weight of a polyimide/amide from pyromellitic dianhydride and 4,4'-diaminodiphenyl ether commercially available under the trade designation AI 10 from Amoco; about 30 parts by weight of N-methyl-2-pyrrolidone; about 12 parts by weight of the polydimethylsiloxane of the type used in Example 1 and about 48 parts by weight of zinc oxide having a particle size of about 1 micron.

The results obtained are similar to those of Example I except that the composition has an improved flexibility. In addition, the remaining composition was removed from the substrate by placing into hot N-methyl-2-pyrrolidone (60°–85° C.) for about 30 to 45 seconds in order to assure complete removal of the coating instead of the spraying with perchloroethylene.

EXAMPLE V

The general process described in Example IV is repeated except that the composition contains about 10 parts by weight of the polyimide/amide; about 25 parts by weight of the N-methyl-2-pyrrolidone; about 15 parts by weight of the polydimethylsiloxane of the type used in Example 1; and about 50 parts by weight of ground glass having a particle size of about 5 microns.

The results obtained are similar to those of Example IV.

EXAMPLE VI

The general process of Example I is repeated except that the composition contains about 20 parts by weight of the Shell Epon 28 epoxy resin; about 20 parts by weight of the polydimethylsiloxane of the type used in Example 1, about 32 parts by weight of zinc oxide having a particle size of about 1 micron; and about 28 parts by weight of glass powder having a particle size of about 10 microns.

The results obtained are similar to those of Example I. The composition is substantially removed during the quenching operation.

EXAMPLE VII

The general process of Example IV is repeated except that the composition is obtained by combining a mixture containing about 16 parts by weight of polyimide/amide and about 84 parts by weight of N-methyl-pyrrolidone with a mixture of about 15 parts by weight of glass powder having a particle size of about 2 to 3 microns and about 45 parts by weight of α-terpineol. The glass power and α-terpineol is premixed prior to admixture with the polyimide/amide by ball-milling for about 24 hours to assure a uniform mixture. The mixture of the polyimide/amide and N-methyl-pyrrolidone is commercially available under the trade designation PI 2550 from Du Pont. In addition, the above mixture is subsequently ball-milled for another 24 hours to insure a uniform composition.

The results obtained are similar to those of Example IV.

EXAMPLE VIII

The general process of Example IV is repeated except that the composition employed is obtained from the mixture of about 16 parts by weight of the polyimide/amide and about 84 parts by weight of the N-methyl-pyrrolidone of the type employed in Example VII with a mixture of about 3 parts by weight of Cabosil (a silica aerogel) having a particle size of about 1 to about 5 microns with about 30 parts by weight of α-terpineol. The Cabosil and α-terpineol are ball-milled together at about 25° C. for about 8 to 12 hours before admixture with the polyimide/amide preparation. The entire mixture is ball-milled for another 12 to 24 hours to ensure adequate mixing.

The results obtained are similar to those of Example IV.

EXAMPLE IX

The general process of Example IV is repeated except that the composition is obtained from a mixture of about 16 parts by weight of polyimide/amide and about 84 parts by weight of N-methyl-2-pyrrolidone of the type employed in Example VII admixed with a mixture of about 10 parts by weight of aluminum oxide having a particle size of about 10 microns and about 30 parts by weight of α-terpineol. The aluminum oxide and α-terpineol are premixed by ball-milling for about 8 to 12 hours. In addition, the composition is ball-milled for another 12 to 24 hours to ensure uniformity.

The results obtained are similar to those of Example IV.

EXAMPLE X

The general process as described in Example IV is repeated except that the composition employed is obtained from a mixture of about 16 parts by weight of the polyimide/amide and about 84 parts by weight of N-methyl-2-pyrrolidone of the type employed in Example VII with a mixture of about 15 parts by weight of zinc oxide having a particle size of about 10 microns and about 30 parts by weight of α-terpineol. The mixture of the zinc oxide with the terpineol is ball-milled for about 18 to about 24 hours prior to admixture with the polyimide/amide composition. In addition, the entire composition is ball-milled for about another 12 to 24 hours.

The results obtained are similar to those of Example IV.

Having thus described our invention, what we claim is new, and desire to secure by Letters Patent is:

1. A screenable, strippable solder mask composition containing:
   A. a film-forming polymer portion in the form of a liquid composition wherein the film-forming polymer is a polyimide/amide or a liquid polyepoxide;
   B. a detackifier compatible with the polymer being selected form the group of
      (1) liquid silicone oil
      (2) terpene
      (3) terpineol
      (4) drying oil, and
      (5) mixtures thereof;
   C. a solid high temperature resistant filler in an amount sufficient to render the composition removable from the substrate after solder application;

wherein the ratio of A:B is about 2:1 to about 1:3, and provided that when A is a polyepoxide liquid, B includes said silicone oil; and wherein said composition is at least substantially free of hardener for said film-forming polymer.

2. The solder mask composition of claim 1 wherein the film-forming polymer is a liquid polyepoxide.

3. The solder mask composition of claim 1 wherein said film-forming polymer is a polyepoxide of epichlorohydrin and bisphenol A.

4. The solder mask composition of claim 1 wherein said polyepoxide has a viscosity of about 400 to about 5000 centipoises at 25° C., and a molecular weight of about 170 to about 250.

5. The solder mask composition of claim 1 wherein said film-forming polymer is a polyimide/amide polymer.

6. The solder mask composition of claim 1 wherein said film-forming polymer portion is a solution of a polyimide/amide in N-methyl-2-pyrrolidone.

7. The solder mask composition of claim 1 wherein said film-forming polymer is a polyimide/amide from pyromellitic dianhydride and 4,4'-diaminodiphenylether.

8. The solder mask composition of claim 1 wherein said detackifier is a liquid silicone oil.

9. The solder mask composition of claim 1 wherein said detackifier is a polydimethylsiloxane.

10. The solder mask composition of claim 1 wherein said detackifier is a terpineol.

11. The solder mask composition of claim 1 wherein said detackifier has a viscosity of about 25 to about 500 centipoises at 25° C.

12. The solder mask composition of claim 1 wherein said filler has a particle size of about 0.1 to about 20 microns.

13. The solder mask composition of claim 1 wherein said filler has a particle size of about 0.1 to about 5 microns.

14. The solder mask composition of claim 1 wherein said filler is selected from the group of ground glass, zinc oxide, silicon dioxide, alumina, high temperature resistant sands, and mixtures thereof.

15. The solder mask composition of claim 1 which has a viscosity of about 700 to about 15,000 centipoises at 25° C.

16. The solder mask composition of claim 1 having a viscosity of about 1000 to about 13,000 centipoises at 25° C.

17. The solder mask composition of claim 1 having a viscosity of about 7000 to about 12,500 centipoises at 25° C.

18. The solder mask composition of claim 1 wherein the ratio of the film-forming polymer of the polymer portion of the composition relative to the detackifier is about 1:1 to about 2:3.

19. The solder mask composition of claim 1 wherein the amount of filler relative to the film-forming polymer component of the polymer portion of the composition is about 1:6 to 6:1.

20. The solder mask composition of claim 1 wherein said detackifier is a natural drying oil.

21. The solder mask composition of claim 1 wherein the amount of filler relative to the film-forming polymer component of the polymer portion of the composition is about 2:1 to about 6:1.

22. The composition of claim 1 which is entirely free of hardener for said film-forming polymer.

23. A substrate coated in predetermined areas less than the entire area with the solder mask of claim 1.

24. The substrate of claim 23 wherein the coating thickness is about 1 to about 25 mils.

25. The method of claim 24 wherein the application of solder is conducted at a temperature of about 300° to about 400° C.

26. The substrate of claim 23 wherein the coating thickness is about 5 to about 10 mils.

27. The substrate of claim 23 wherein the coating thickness is about 2 to about 3 mils.

28. A method for protecting predetermined areas on a substrate from solder deposition which comprises:
   A. applying to predetermined areas less than the entire area of a substrate by screen printing a screenable and strippable mask composition containing:
      (1) a film-forming polymer portion in the form of a liquid composition wherein the film-forming polymer is a polyimide/amide or a liquid polyepoxide;
      (2) a detackifier compatible with the polymer being selected from the group of
         (a) liquid silicone oil
         (b) terpene
         (c) terpineol
         (d) drying oil, and
         (e) mixtures thereof;
      (3) a solid high temperature resistant filler in an amount sufficient to render the composition removable from the substrate after solder application
   wherein the ratio of A:B is about 2:1 to about 1:3, and provided that when A is a polyepoxide liquid, B includes said silicone oil; and wherein said composition is at least substantially free of hardener from said film-forming polymer;
   B. drying the coated substrate to thereby harden the composition;
   C. applying solder whereby said solder does not adhere to those areas protected by the solder mask;
   D. removing the solder mask.

29. The method of claim 28 wherein said solder mask is removed by contact with a solvent at elevated temperature.

30. The method of claim 28 wherein said elevated temperature is about 100° to about 180° C.

31. The method of claim 28 wherein said drying is conducted at a temperature of about 50° C. to about 150° C.

32. The method of claim 28 wherein said drying is conducted at a temperature of about 150° C.

33. The method of claim 28 wherein said composition is entirely free of hardener for said film-forming polymer.

* * * * *

UNITED STATES PATENT AND TRADEMARK OFFICE
CERTIFICATE OF CORRECTION

PATENT NO. : 4,246,147
DATED : January 20, 1981
INVENTOR(S) : Bakos et al

It is certified that error appears in the above—identified patent and that said Letters Patent is hereby corrected as shown below:

Column 6, line 30, change "$R^1$" to --R'--; and
        line 45, change "$R_1$" to --R'--.
Column 8, line 56, change "radiclas" to --radicals--.
Column 12, line 46, change the comma "," to a semicolon --;--.
Column 13, line 1, after "Example 1" insert a semicolon --;--;
        line 28, change the comma "," to a semicolon --;--; and
        line 44, change "power" to --powder--, and delete "is" and insert therefor --are--.

Signed and Sealed this

Tenth Day of November 1981

[SEAL]

Attest:

GERALD J. MOSSINGHOFF

Attesting Officer    Commissioner of Patents and Trademarks